(12) United States Patent
Chen et al.

(10) Patent No.: US 10,703,016 B2
(45) Date of Patent: Jul. 7, 2020

(54) SEMICONDUCTOR SAWING METHOD AND SYSTEM

(71) Applicant: TEXAS INSTRUMENTS INCORPORATED, Dallas, TX (US)

(72) Inventors: Chi-Hung Chen, New Taipei (TW); Tung-Mei Tien, New Taipei (TW); Hung-Yu Wang, New Taipei (TW)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 197 days.

(21) Appl. No.: 16/013,926

(22) Filed: Jun. 20, 2018

(65) Prior Publication Data

US 2019/0389091 A1    Dec. 26, 2019

(51) Int. Cl.
| | |
|---|---|
| *H01L 21/00* | (2006.01) |
| *B26D 7/10* | (2006.01) |
| *B28D 5/02* | (2006.01) |
| *B28D 5/00* | (2006.01) |
| *H01L 21/683* | (2006.01) |
| *H01L 21/78* | (2006.01) |
| *H01L 21/67* | (2006.01) |
| *H01L 21/304* | (2006.01) |
| *H01L 21/02* | (2006.01) |

(52) U.S. Cl.
CPC .......... *B28D 5/024* (2013.01); *B28D 5/0076* (2013.01); *B28D 5/0082* (2013.01); *B28D 5/027* (2013.01); *H01L 21/304* (2013.01); *H01L 21/67028* (2013.01); *H01L 21/67051* (2013.01); *H01L 21/6836* (2013.01); *H01L 21/78* (2013.01); *H01L 21/02057* (2013.01); *H01L 21/67017* (2013.01)

(58) Field of Classification Search
CPC .... B28D 5/024; B28D 5/0076; B28D 5/0082; B28D 5/027; H01L 21/78; H01L 21/6836; H01L 21/67051; H01L 21/67028; H01L 21/304; H01L 21/67017; H01L 21/02057
See application file for complete search history.

(56) References Cited

U.S. PATENT DOCUMENTS

| | | | |
|---|---|---|---|
| 4,688,540 A | 8/1987 | Ono | |
| 2008/0153260 A1 | 6/2008 | Ancheta et al. | |
| 2008/0286697 A1* | 11/2008 | Verhaverbeke | ... H01L 21/67069 430/322 |
| 2014/0298969 A1* | 10/2014 | Kozai | ............... H01L 21/67092 83/477.1 |

OTHER PUBLICATIONS

Fauty, Joseph, et al., "Al—Cu Metal Bond Pad Corrosion During Wafer Saw", The International Journal of Microcircuits and Electronic Packaging, vol. 24 No. 1, 2001, pp. 19-29.

* cited by examiner

*Primary Examiner* — Alonzo Chambliss
(74) *Attorney, Agent, or Firm* — Dawn Jos; Charles A. Brill; Frank D. Cimino

(57) ABSTRACT

In one instance, a method of manufacturing an integrated circuit includes a method for dicing a semiconductor wafer that includes disposing the semiconductor wafer on a moveable cutting table, cutting the semiconductor wafer, and ejecting a clearing fluid across an exposed side of the semiconductor wafer, with full coverage across the semiconductor wafer, at least during the cutting of the semiconductor wafer. The ejecting clearing fluid is ejected to form a layer or membrane of fluid that clears or reduces other fluids from the exposed side or surface of the semiconductor wafer. Other aspects are presented.

26 Claims, 6 Drawing Sheets

SEMICONDUCTOR SAWING METHOD AND SYSTEM

TECHNICAL FIELD

This relates generally to semiconductor devices and manufacturing, and more particularly to methods and systems for sawing semiconductor wafers.

BACKGROUND

Semiconductor devices are used in many applications. In the manufacturing process of semiconductor devices, one step involves wafer dicing. Wafer dicing is the process of cutting a semiconductor wafer into separate individual chips, or dice, assembled on the wafer. The wafer is ordinarily placed and secured or mounted horizontally atop a cutting table. A wafer frame is used to support the wafer, which is usually placed on a tape, one side of which has a sticky surface that holds the wafer during sawing. Saw equipment including a spindle assembly for manipulating a rotating circular blade is positioned atop the secured wafer. The wafer is sawn into individual chips by cutting through saw streets pre-defined on the wafer for that purpose.

SUMMARY

According to an aspect, a method of manufacturing an integrated circuit includes sawing a semiconductor wafer, attaching the plurality of die to a plurality of leadframes, interconnecting each of the plurality of die to a corresponding leadframe of the plurality of leadframes, and applying to each leadframe a mold compound over at least a portion of any die on the leadframe and at least a portion of the leadframe. The sawing of the semiconductor wafer includes providing a cutting table, securing the semiconductor wafer in a sawing position, and applying a spinning saw blade to the wafer secured in the sawing position to cut the wafer into a plurality of separated die. The sawing of the semiconductor wafer further includes applying a first fluid for cooling to the semiconductor wafer proximate where the spinning saw blade touches the semiconductor wafer, and applying a second fluid to substantially all of an exposed side of the semiconductor wafer. The applying a second fluid includes using a fluid ejector element proximate the cutting table and coupled to the cutting table. The fluid ejector element is positioned proximate an edge of the semiconductor wafer when mounted in the sawing position to eject the second fluid across substantially all of the exposed side of the semiconductor wafer and substantially parallel to the exposed side.

According to an aspect, a method of manufacturing an integrated circuit includes sawing a semiconductor wafer into separate die along one or more streets formed on the semiconductor wafer, attaching the plurality of die to a plurality of leadframes, interconnecting each of the plurality of die to a corresponding leadframe of the plurality of leadframes, and applying to each leadframe a mold compound over at least a portion of any die on the leadframe and at least a portion of the leadframe. The aspect of sawing a semiconductor wafer into separate die includes cutting the semiconductor wafer along the one or more streets to form a plurality of die, wherein the semiconductor wafer has a first side and a second side, and wherein the first side is exposed. The aspect of sawing a semiconductor wafer into separate die further includes applying a first fluid at a location proximate to where the semiconductor wafer is being cut for cooling, and ejecting (at least during sawing) a second or clearing fluid across substantially all of the first side of the semiconductor wafer in a layer of fluid to remove any of the first fluid that would otherwise be standing on the first side of the semiconductor wafer.

According to an aspect, a method for dicing a semiconductor wafer into separate die includes mounting the semiconductor wafer on a moveable cutting table, cutting the semiconductor wafer, and ejecting a clearing fluid across an exposed side of the semiconductor wafer at least during cutting, with full coverage across the semiconductor wafer. Full coverage means that at least 90 percent of the exposed side has the clearing fluid move across the exposed side. Ejecting the clearing fluid is to remove any other liquid fluids from standing on an exposed side of the semiconductor wafer. Ejecting a clearing fluid includes forming substantially a layer of clearing fluid that traverses the semiconductor wafer substantially parallel to the plane of the exposed side of the semiconductor wafer to remove any fluids, e.g., cooling fluids, on the exposed side of the semiconductor wafer.

According to an aspect, a system for sawing a semiconductor wafer includes a moveable cutting table for receiving the semiconductor wafer and having a sawing configuration, a dicing saw associated with the cutting table for cutting semiconductor wafers, and a fluid ejector element coupled to the moveable table. The fluid ejector element includes a plurality of nozzles configured to produce a layer of fluid that goes across the semiconductor wafer and provides full coverage. Other aspects are disclosed herein.

DETAILED DESCRIPTION

Figure 1:
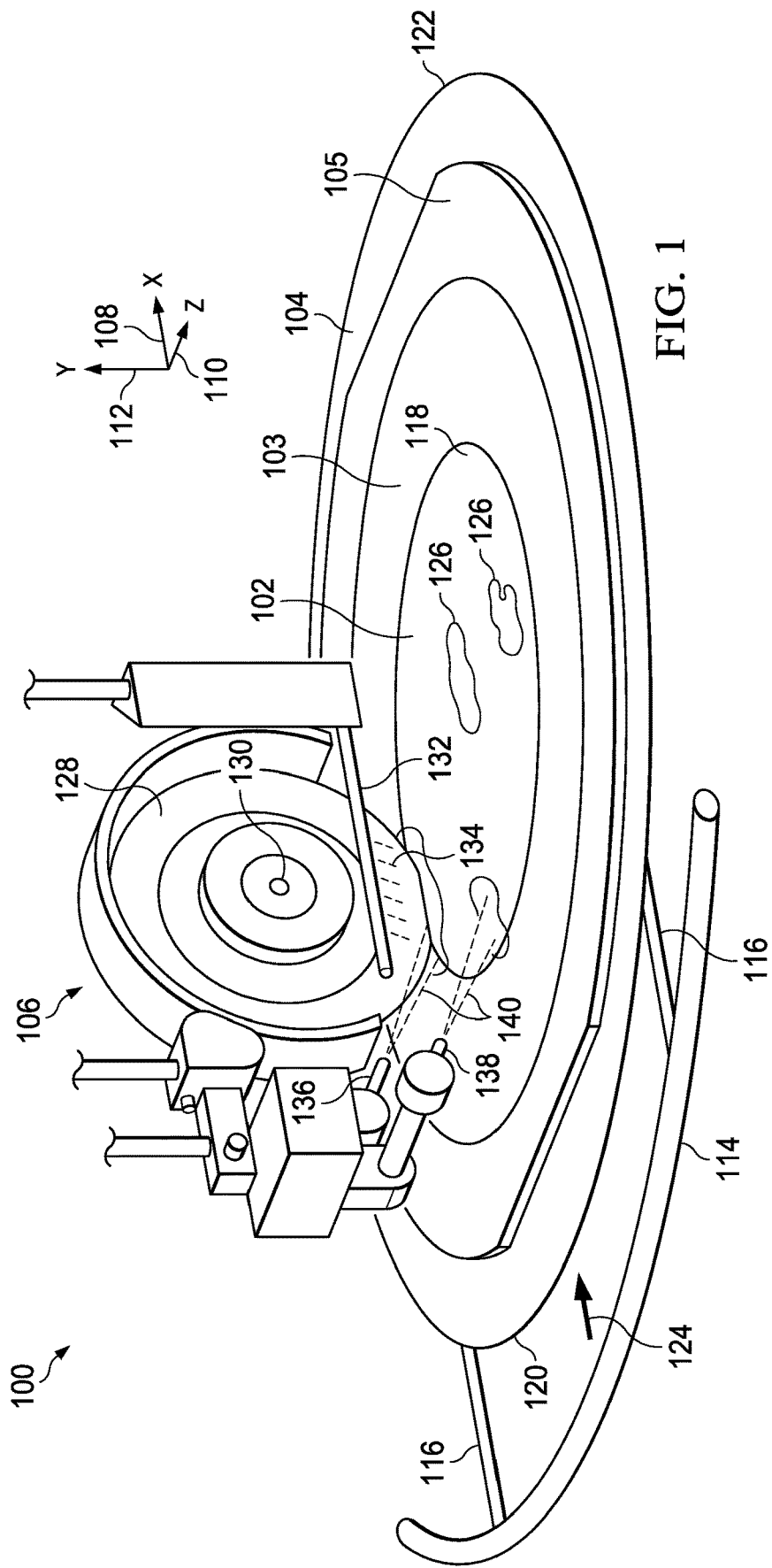
FIG. 1 is a schematic, perspective view of an illustrative system for sawing a semiconductor wafer that includes a fluid ejector element.

Wafer dicing is the process of cutting a semiconductor wafer into separate individual microelectronic chips, or dice, assembled on the wafer. The wafer is ordinarily placed and secured or mounted horizontally atop a cutting table. A wafer frame is used to support the wafer, which is usually placed on a tape, one side of which has a sticky surface that holds the wafer during sawing. Saw equipment including a spindle assembly for manipulating a rotating or spinning circular blade is positioned atop the secured wafer. The wafer is sawn into individual chips by cutting through saw streets pre-defined on the wafer.

Water nozzles may be used to spray the wafer during the sawing process at the cut location. This wet environment can cause issues. At times, aluminum may be used with a thin film metallization for contacting silicon and forming interconnection lines on the integrated circuits. To address electromigration issues, copper may be added to the aluminum to form an alloy. The copper content may vary, e.g., 0.5 to 4.5 percent by weight in one application. With the use of Al—Cu alloys there is an increased susceptibility of the film to corrosion during wafer fabrication and post wafer fabrication assembly. In the wet cutting environment, three types of corrosion are known: galvanic or dissimilar metal cells, concentration cells, and electrolytic cells. The corrosion requires two electrodes, an interconnecting solution, and a driving force.

The wet cutting environment promotes corrosion and is an issue when the semiconductor wafer includes copper. For example, in manufacturing integrated circuits (IC) having bond over active circuits (BOAC), without addressing standing water, a higher than desirable failure rate may result in the form of non-sticking bonds on pads (NSOP). This is due to galvanic bond pad corrosion of the BOAC. The corrosion is caused by electroplating of oxidized copper particles on the Pmoat bond pads that result in NSOP errors at the wire bond.

Without being limited by theory, during the sawing process, copper ions enter the saw water and deposit onto cathode bond pads caused by electrochemical potential differences between adjacent P-moat and N-moat pads. Once the copper is deposited on the palladium, it is oxidized causing corrosion. The saw water provides an interconnecting ionic solution that allows the redox reaction to take place.

The reactions are as follows for a wafer with Pd, Ni, Cu on chip to BOAC connection. On the P-moat side, it would be:

$CU^+ + 1e^- \rightarrow Cu^0$
$2H^+ + 2e^- \rightarrow H_2$
$O_2 + 4H^+ + 4e^- \rightarrow H_2O$ On the N-moat side, it would be:

$CU^0 \rightarrow CU^+ + 1e^-$
$CU_2O \rightarrow 2CU^+ + 2e^- + \frac{1}{2}O_2$
$CU_2O \rightarrow 2CU^+ + O^{2-}$ The approaches to reduce standing water presented in the methods and systems herein have applicability to wafers without copper, but copper is a prominent concern.

One factor observed to contribute to corrosion is the time the wafer is exposed to standing, or static, water on the wafer. To address this, a continual water flow across the wafer is formed to keep pools or collections of standing water from forming on the top or exposed side of the wafer. Thus, in one aspect, a method for dicing a semiconductor wafer into separate die is provided that includes mounting the semiconductor wafer on a moveable cutting table, cutting the semiconductor wafer, and ejecting a clearing fluid across an exposed side of the semiconductor wafer, with full coverage across the semiconductor wafer, at least during the cutting of the semiconductor wafer. The ejection of the clearing fluid is any time the other fluids (cooling and lubricating) are being ejected or at a minimum during cutting. The clearing fluid ejection occurs during cutting and may be stopped or paused when the cutting is stopped or paused. After cutting, the clearing fluid ejection is stopped.

Referring now to the drawings and initially to FIG. 1, a system 100 for sawing a semiconductor wafer 102 includes a moveable cutting table 104 for receiving the semiconductor wafer 102. The semiconductor wafer 102 may be put in a cutting position by holding the wafer 102 with tape 103 on a wafer frame 105 and then mounting or securing the semiconductor wafer on the moveable cutting table 104 such as by vacuum. The semiconductor wafer 102 may take many forms. In one example, the semiconductor wafer 102 includes copper. In one example, the semiconductor wafer 102 comprises a plurality of integrated circuits with a bonding layer over active circuitry that further comprises copper.

The moveable cutting table 104 has a sawing configuration. A dicing or cutting saw 106 is associated with the cutting table 104 for cutting semiconductor wafers. The moveable cutting table 104 moves in the plane defined by an x-axis 108 and a z-axis 110. The dicing saw 106 moves in the vertical or y-axis 112 and z-axis 110.

A fluid ejector element 114 is coupled to the moveable cutting table 104. The fluid ejector element 114 may be coupled to the moveable cutting table 104 by attachment arms 116 or mounting blocks (see, e.g., mounting block 512 in FIG. 5) or other fastener devices. The fluid ejector element 114 ejects a clearing fluid across a first, exposed surface 118 or side of the semiconductor wafer 102 from a first edge 120 of the moveable cutting table 104 to a second edge 122 of the moveable cutting table 104. As used herein, "exposed side" means the side of the semiconductor wafer 102 that is facing up for the orientation shown in FIG. 1 and that is on the opposite side from the side of the wafer that is supported by and is against the moveable cutting table 104. The clearing fluid ejected by the fluid ejector element 114 is in the direction shown by reference arrow 124. The ejecting clearing fluid forms a membrane of fluid or a layer of fluid that removes any standing liquid fluid, e.g., standing liquid fluid 126, from the first, exposed side 118. The system 100 is shown in FIG. 1 with the fluid ejector element 114 not ejecting fluid in order to show an example of the standing liquid fluid 126 that would exist without the fluid ejector element 114 in operation.

The standing liquid fluid 126 comes from other fluids being used in the cutting process. The dicing saw or cutting saw 106 includes a cutting blade 128, e.g., a plated diamond wheel, on a spindle 130 that can rotate or spin at high revolutions per minute. The cutting saw 106 may include various components that one skilled in the art would understand, e.g., detection device, alignment devices, and transfer devices, that are not further described. A first nozzle 132 may eject a fluid 134 for cooling or lubrication. A second nozzle 136 or third nozzle 138 may eject a fluid 140 for removing silicon dust or debris from cutting or cooling fluid or lubricating. The fluids delivered by the various nozzles 132, 136, 138 coupled to the cutting saw 106 may form the standing liquid fluid 126 on the first side of the wafer 118. Again the standing liquid fluid 126 promotes corrosion and is addressed herein by the fluid ejector element 114.

The fluid membrane or layer is produced by the fluid ejector element 114 that may be coupled to an outer wafer cutting table. It moves with the table 104 and ejects a clearing fluid to give impetus to the standing fluid 126 to move and thereby to avoid standing liquid fluid on the wafer 102. The fluid ejector element 114 ejects a fluid in a pattern that creates a fluid membrane or full coverage fluid layer or fluid wall across (e.g., substantially parallel to) the exposed surface 118 of the semiconductor wafer 102 to remove any standing water 126 that would otherwise pool or gather on the exposed surface 118 of the semiconductor wafer 102. The clearing fluid from the fluid ejector element 114 contacts any cooling/lubricating fluids sprayed from other nozzles and removes the cooling/lubricating fluids from the exposed side 118 of the semiconductor wafer 102. Again, this eliminates or reduces any standing liquid fluids, e.g., water, delivered from the other nozzles that could promote corrosion.

The fluid ejector element 114 may comprise a plurality of nozzles (see, e.g., 216 in FIG. 2, 322 in FIG. 3, 417 in FIG. 4, 520 in FIG. 5, 702 in FIG. 7) configured to produce the layer of fluid that goes across the semiconductor wafer 102 and provides full coverage. Full coverage helps to avoid the standing liquid fluid 126 remaining. By ejecting the fluid from the fluid ejector element 114 during cutting, the liquid fluid from nozzles 132, 136, 138 is removed from the first surface 118 of the wafer 102 such that standing liquid fluid 126 is reduced or eliminated. The ejection from the fluid ejector element 114 may be stopped when the cutting process is complete or paused if the cutting process is paused.

The fluid ejector element 114 may be coupled with locks on a portion of the cutting table 104 as will be described in other embodiments as well. The fluid ejector element 114 is coupled a distance from the outer edge of the cutting table 104 (from first edge 120). The distance may be between 5 and 100 mm or some other dimension. In one illustrative arrangement, the fluid ejector element 114 is greater than 35 mm away from the cutting table edge (see, e.g., distance 416 in FIG. 4). In one illustrative arrangement, the fluid ejector element 114 is approximately 46 mm away from the cutting table edge (see, e.g., distance 416 in FIG. 4). In one illustrative arrangement, the fluid ejector element 114 is about 400 mm in coverage in the x-z plane for an illustrative application to a full 300 mm wafer. The fluid layer or membrane that is formed by the collective ejection from the fluid ejector element 114 goes across the wafer 102 and may hit a portion of fluid collection portions of the system 100. This is presented clearly in FIG. 2.

Figure 2:
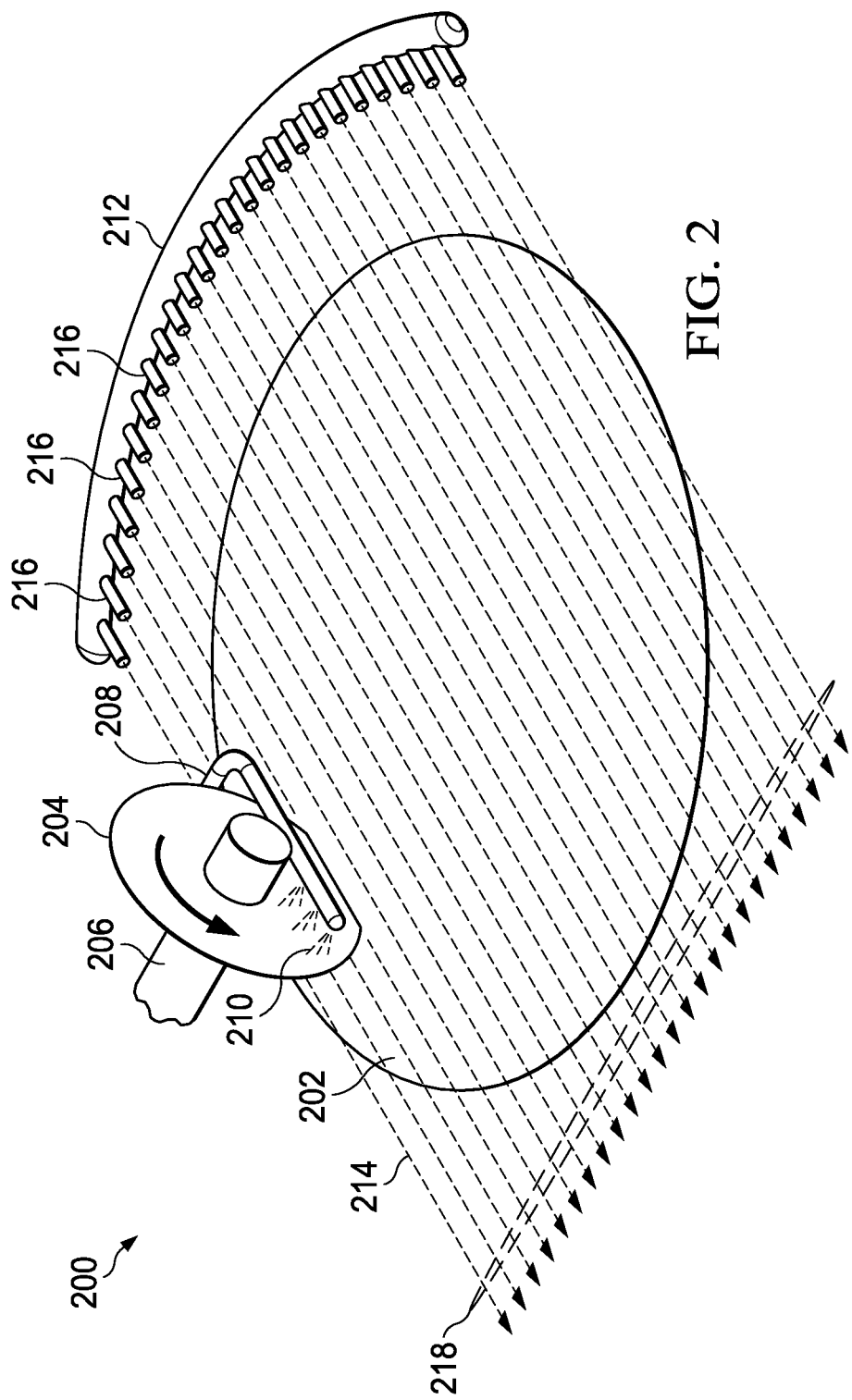
FIG. 2 is a schematic, perspective view of a portion of an illustrative system for sawing a semiconductor wafer that includes a fluid ejector element.

Referring to FIG. 2, an illustrative schematic, perspective view of a portion of an illustrative system 200 (analogous to the system 100 of FIG. 1) for sawing a semiconductor wafer 202 is presented. The system 200 includes a spinning saw blade 204 on a spindle 206. The semiconductor wafer 202 is supported and moved by a moveable table (not explicitly shown to more clearly show other aspects but analogous to table 104 of FIG. 1). A nozzle 208 ejects a cooling or lubricating fluid 210. A fluid ejector element 212 is offset from the table and thus from the semiconductor wafer 202 and ejects a clearing fluid 214. The fluid ejector element 212 includes a plurality of nozzles 216. The clearing fluid 214 ejected by the plurality of nozzles 216 of fluid ejector element 212 together form a layer or membrane 218 that traverses the entire wafer 202 in this illustrative arrangement. The clearing fluid pressure and plurality of nozzles 216 allow a layered or membrane like stream to shoot across the exposed surface of the wafer in contact or just above the wafer to impact any standing water from other aspects of the operation and remove them due to the force of the clearing fluid. In this way, no or reduced amounts of standing liquid remain on an exposed or first surface 220 of the wafer 202. The layer or membrane nature of the ejected clearing fluid may be seen clearly in the illustrative example of FIG. 3. While shown as nearly a perfect straight line, it should be understood that some variation will occur in the stream, but a layer of clearing fluid will be delivered that will remove any fluids that would otherwise remain as standing liquid fluid on the exposed surface 220.

Figure 3:
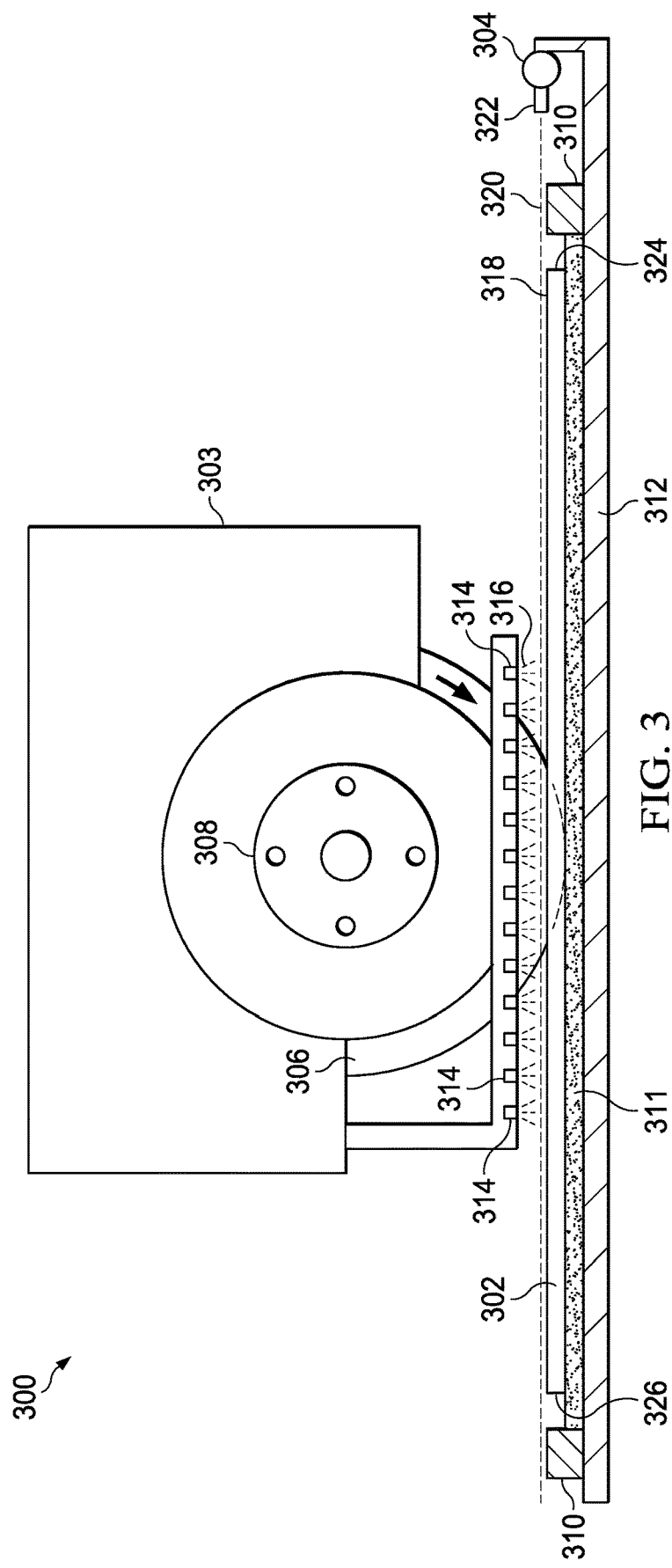
FIG. 3 is a schematic diagram in elevation of a portion of an illustrative system for sawing a semiconductor wafer that includes a fluid ejector element.

Referring now to FIG. 3, a schematic diagram in elevation of a portion of an illustrative system 300 for sawing a semiconductor wafer 302 that includes a fluid ejector element 304 is presented. The system 300 includes a cutting saw 303 having a cutting blade 306 on a spindle 308 that rotates or spins at high revolutions per minute (rpm) to cut the wafer 302. The wafer 302 is mounted to a frame 310 with tape 311 and mounted on moveable table 312. A plurality of cooling or lubricating nozzles 314 are coupled to the cutting saw 303 and ejects a first fluid 316 onto a first side 318 of the wafer 302 to cool or lubricate the wafer during cutting. Again, that fluid 316 might pool or collect on the first side 318 without inhibition but for a clearing fluid 320 that is ejected from the fluid ejector element 304 to remove or urge the first fluid 316 off of the first side 318.

The clearing fluid 320 may take a number of forms. In one example, the clearing fluid 320 is deionized water (DIW). Other fluids, e.g., air, could be used. The DIW is typically passed through a $CO_2$ bubbler to mix $CO_2$ into it to control water resistivity. The clearing fluid 320 is ejected at a rate to go from one end 324 to the other end 326 of the wafer 302 or from one end of the table to the other. This rate varies with the nozzle specifics, the dimension of the wafer 302, and the distance from the table edge to where the wafer 302 resides. In one example, the flow rate is between 4 to 8 liters/minute, and in one example is about 6L/min. If a weaker flow rate is used, the distance of coverage might be less. Enough pressure is desired to eject the clearing fluid 320 across the wafer 302 and provide full coverage. The ejection occurs whenever the cutting process is occurring.

The fluid ejector element 304 includes a plurality of nozzles 322, but only one is visible in this view because the fluid ejector element 304 is straight in this example and not arced as in the previous examples. The arc shape (see the fluid ejector elements 114, 212) helps to keep similar distances from the fluid ejector element to the moveable table to ensure good coverage, but other shapes may be used such as straight as shown in FIG. 3.

Figure 4:
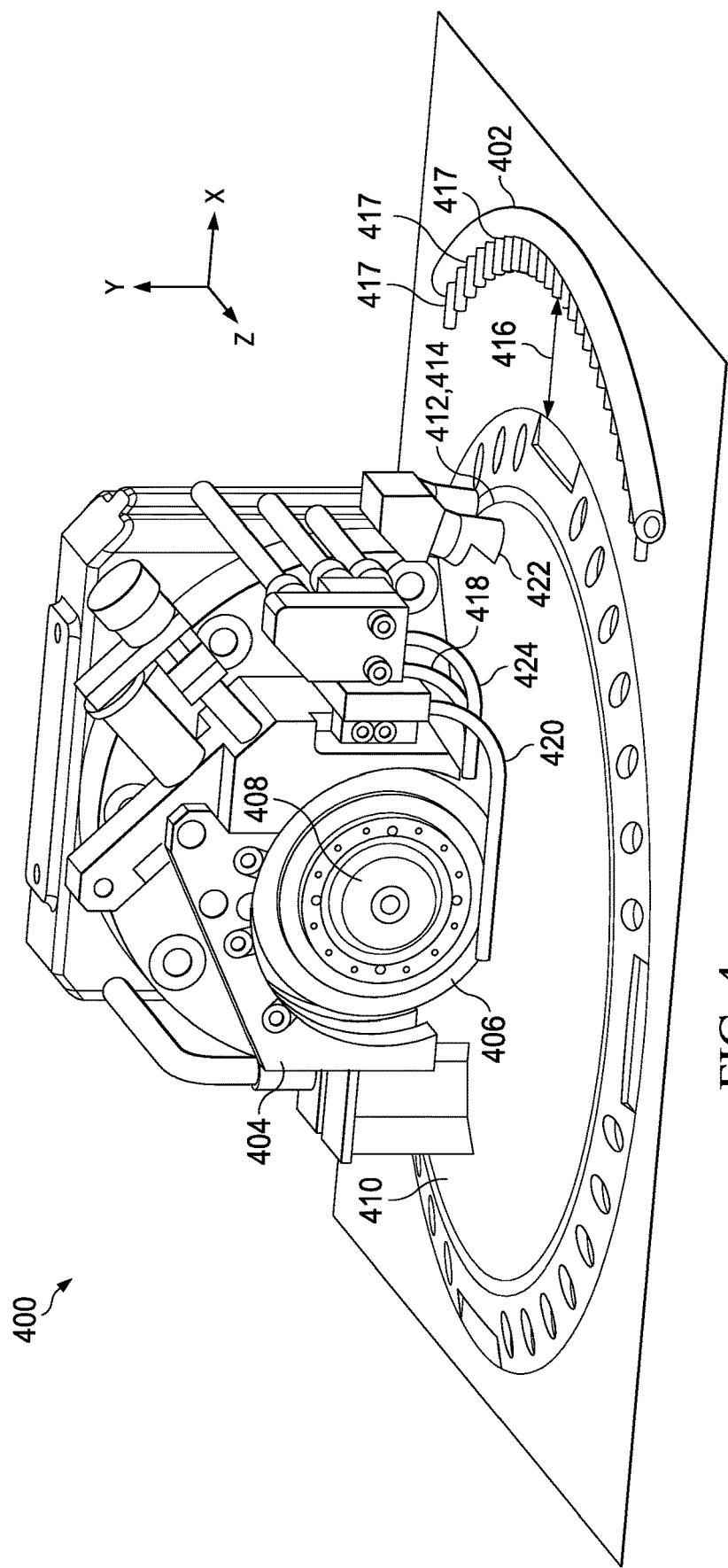
FIG. 4 is a schematic, perspective view of a portion of an illustrative system for sawing a semiconductor wafer that includes a fluid ejector element.

Referring now primarily to FIG. 4, a schematic, perspective view of a portion of an illustrative system 400 for sawing a semiconductor wafer (not show for clarity of other parts in this example but analogous to wafers 102, 202, 302) that includes a fluid ejector element 402. The system 400 includes a cutting saw 404 with cutting blade 406 on a rotating or spinning spindle 408. The cutting saw 404 moves the cutting blade 406 toward a cutting table 410. The cutting table 410 has an outer edge 412 on one end 414 of a mounting portion.

The fluid ejector element 402 is coupled to the cutting table and displaced in the x-z plane a distance 416 from the outer edge 412 of the mounting portion. The fluid ejector element 402 in this embodiment is arced and has a plurality of nozzles 417.

The cutting saw 404 further includes a number of nozzles that are coupled to or form a portion of and move with the cutting saw 404. The cutting saw 404 includes a first blade cooling nozzle 418, a second blade cooling nozzle 420, a first cleaning nozzle 422, and a second cleaning nozzle 424. The various nozzles 418, 420, 422, 424 would possibly leave standing liquid or more standing liquid but for the fluid ejector element 402 ejecting a layer or membrane of cleaning fluid (not shown but analogous to 320 in FIG. 3).

Figure 5:
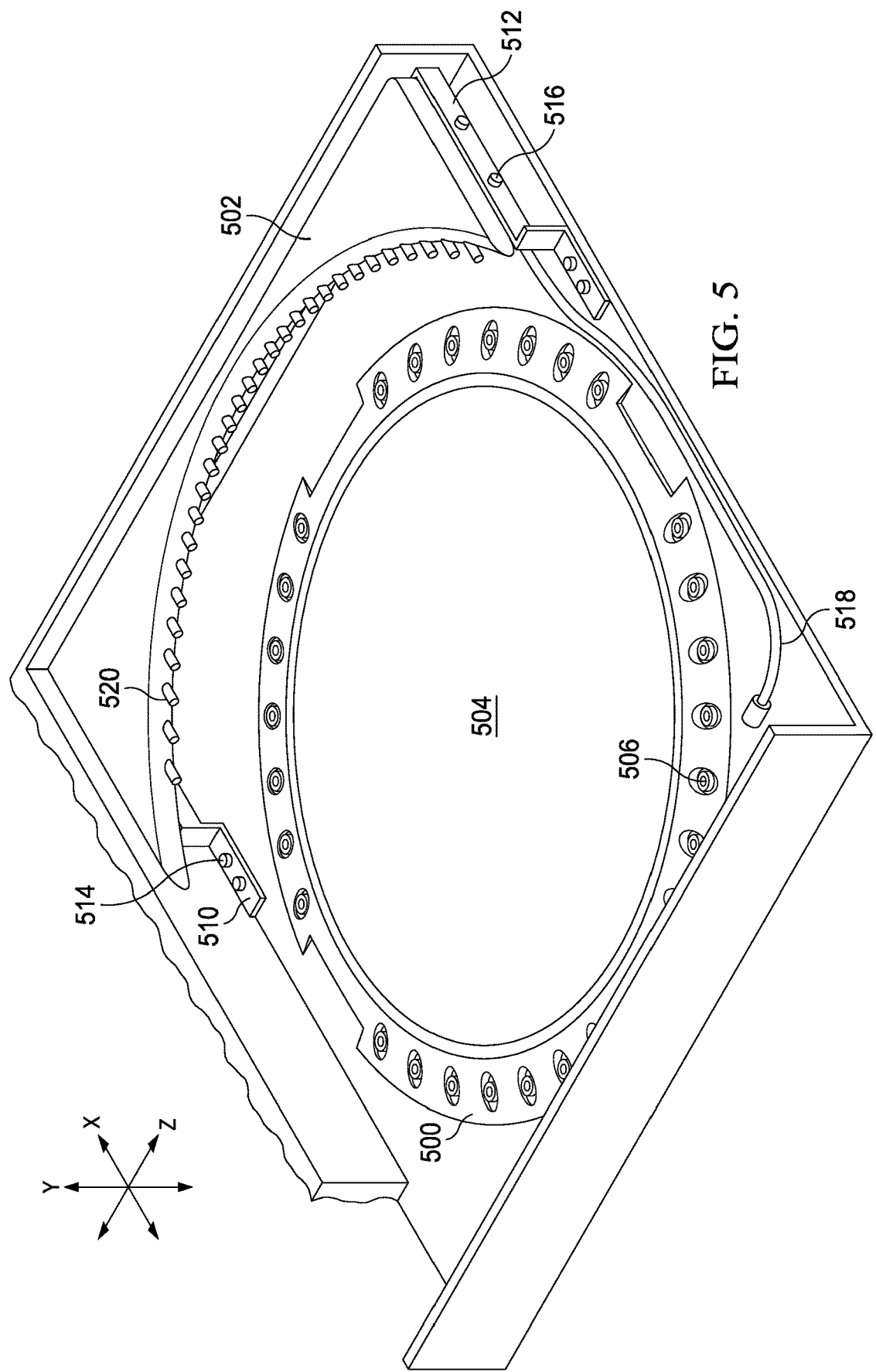
FIG. 5 is a schematic, perspective view of an illustrative cutting table and fluid ejector element.

Referring now primarily to FIG. 5, a schematic, perspective view of an illustrative moveable cutting table 500 and fluid ejector element 502 is presented. The cutting table 500 has a mounting portion 504 that may include vacuum apertures for holding a semiconductor wafer (see, e.g., 302)

to the cutting table 500. The cutting table 500 includes a support member 506 for supporting a tape frame (see, e.g., 105). The moveable cutting table 500 moves the mounting portion 504 as required for the cuts to be made by a cutting saw (not shown, but see, e.g., 404). The mounting portion 504 is on a platform 508.

The fluid ejector element 502 is mounted to the cutting table by one or more mounting locks 510 coupled to a mounting block 512 that is coupled to the fluid ejector element 502. One or more fasteners 514 may couple the mounting lock 510 to the platform 508 or another portion of the table 500. Likewise, one or more fasteners 516 may couple the fluid ejector element 502 to the mounting lock 510 or directly to the platform 508. A fluid line 518 provides a clearing fluid to the fluid ejector element 502. A plurality of nozzles or a channel nozzle 520 are included as aspect of the fluid ejector element 502 and are aimed toward the mounting portion 504 of the table 500. The fluid ejector element 502 is arced and has the same center of curvature as the table 500 in this example.

Figure 6:
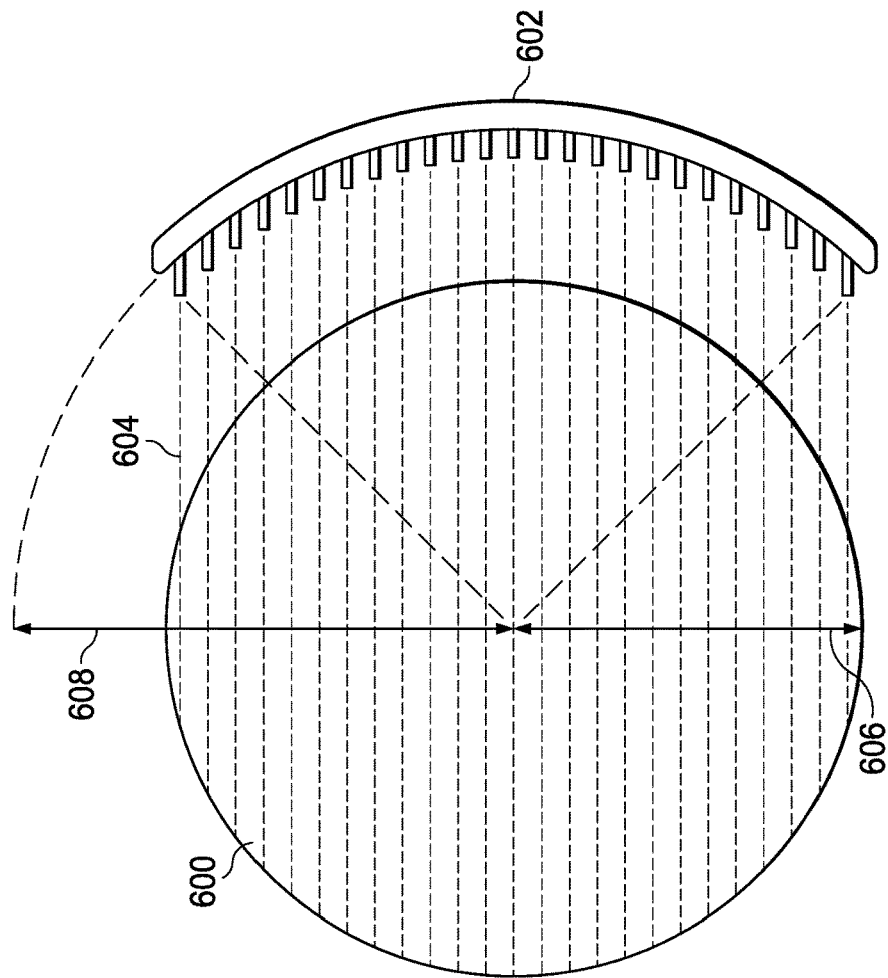
FIG. 6 is a schematic, plan view of a semiconductor wafer on an illustrative cutting table with a fluid ejector element ejecting a fluid across the semiconductor wafer.

Referring now primarily to FIG. 6, a schematic, plan view of a semiconductor wafer 600 on an illustrative cutting table with a fluid ejector element 602 ejecting a clearing fluid 604 across the semiconductor wafer 600 is shown. The wafer 600 has a radius 606. The fluid ejector element 602 is arced and has a radius of 608. The angle of overlap is such that full coverage of clearing fluid 604 across the wafer 600 is provided.

Figure 7:
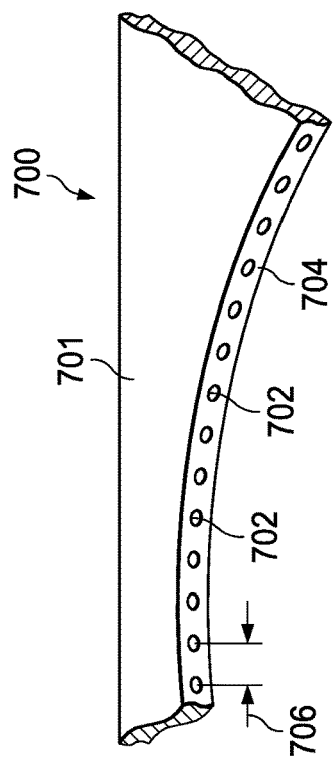
FIG. 7 is a schematic, perspective view of a portion of an illustrative fluid ejector element.

Referring now primarily to FIG. 7, a schematic, perspective view of a portion of an illustrative fluid ejector element 700 is presented. In this example, the fluid ejector element 700 is a plastic member or arced housing 701 with a plurality of nozzles 702 formed as apertures 704. The spacing of the intervals 706 between apertures 704 may vary as needed to provide a full layer or membrane of fluid when ejected at operating pressure and flow. In one illustrative example, the nozzle interval 706 is between 2 and 8 mm. In another example, the nozzle interval is 4 mm. In another example, a small track or channel is provided that ejects a layer of fluid.

Figure 8:
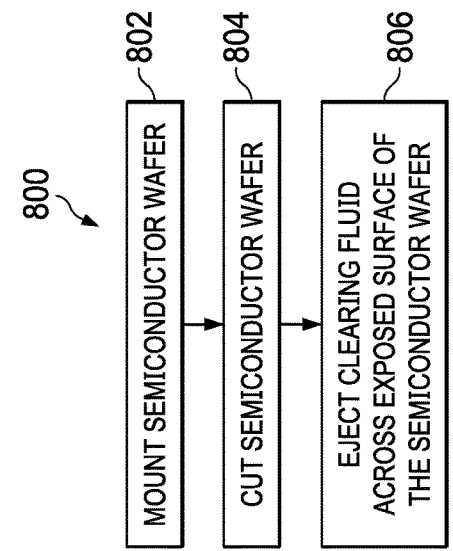
FIG. 8 is a flow process of an illustrative method for dicing a semiconductor wafer into separate dice.

Referring now primarily to FIG. 8, a flow process 800 of an illustrative method for dicing a semiconductor wafer into separate die or dice is presented. The process begins 802 with mounting the semiconductor wafer on a moveable cutting table. The wafer is cut 804 using a cutting saw while a clearing fluid is ejected 806 in a layer or membrane across the exposed surface of the wafer to remove or reduced a standing liquid fluid that would otherwise pool or gather in greater quantities. This helps to reduce corrosion and failures that can go with corrosion.

In one illustrative process, a semiconductor wafer is placed on the cutting table and a wafer pattern alignment is used to locate pre-defined saw streets. A saw blade spindle is rotated with water applied for cooling or lubrication. The blade cuts in a y-axis direction while the table moves the wafer on pre-defined saw streets and later along the z-axis at another pre-defined saw street. The cutting table moves on a plane back and forth to make the wafer cut along the desired path. Nozzles wet the wafer along the pre-defined saw streets. During the cutting a clearing membrane or layer of water is applied that ejected parallel to the plane of the exposed surface of the wafer and proximate to the surface so that any fluid from other nozzles thereon is forced off the wafer. After the cutting is completed, the wafer is transferred to a cleaning table for overall cleaning and drying.

As used herein, "substantially all of an exposed side of the semiconductor wafer" means that at least 90% of the wafer's exposed side. "Substantially parallel" as used herein means within 10 degrees.

The semiconductor sawing process, or wafer dicing, is one aspect of the integrated circuit ("IC") manufacturing process. The wafer may be thinned before dicing. The wafer is mounted with their active surfaces exposed. The mounting uses release tape fixed to a frame. The wafers are then sawed or diced as discussed herein. The dicing machine or cutting station uses a program to drive the saw blade down the saw street at defined spindle speeds, depths, and saw rate, in order to separate the wafer into individual die.

Each separated die is subjected to bonding or an interconnection process. The separated die are usually pulled from the releasable tape and mounted to a carrier frame or leadframe. The die is oriented and a die-attach machine adheres the die to the frame. The die may be cured on the frame and then wire bonding is done. Bonding electrically couples the die to the leadframe.

After wire bonding or interconnecting, the mold compound is applied to cover some or all of the components of the integrated circuit. A lead finish process may then be used to prepare or enhance leads. Depending on the process, the part on the leadframe may be marked and the packages may be singulated from a strip. Straight, gull, or J bend leads or pins are formed. The integrated circuit may then be inspected and prepared for shipment.

In the various arrangements presented, once the semiconductor wafer has been cut, the semiconductor wafer is removed from the cutting station and will have a detailed cleaning process on the wafer. The semiconductor wafer is moved from the cutting table to a cleaning table. The cleaning at the cleaning table is different than keeping standing liquid fluids off the exposed side of the semiconductor wafer during the cutting process on the cutting table. The clearing fluid helps avoid standing liquid and also helps to drain out or remove silicon debris or powder while cutting.

The nozzles (see, e.g., 216 in FIG. 2, 322 in FIG. 3, 417 in FIG. 4, 520 in FIG. 5, 702 in FIG. 7) ejecting or spraying the clearing fluid form a layer or membrane or curtain of liquid fluid across the exposed side of the semiconductor wafer that has sufficient force to travel across the diameter of the semiconductor wafer without touching the exposed side or in other arrangements can touch the exposed side but the clearing fluid is still carried off the far end of the wafer due to the energy imparted to the clearing fluid. Again, any liquid fluids encountered by the clearing fluid are impacted and driven off of the exposed side of the semiconductor wafer. Preventing the pooling of cooling/lubricating liquids from the exposed side of the wafer during longer cutting times in particular may reduce corrosion. The layer of clearing fluid is presented by nozzles that go the width of the semiconductor wafer and thus provide full coverage—although full coverage can be defined as being 90% or greater of the surface of the semiconductor wafer. In some arrangements, the ejector nozzles delivering the clearing fluid are coupled to the moveable table by mounting blocks and move with the table holding a relative position with respect to the semiconductor wafer.

According to an aspect, a method of manufacturing an integrated circuit includes sawing a semiconductor wafer, attaching the plurality of die to a plurality of leadframes, interconnecting each of the plurality of die to a corresponding leadframe of the plurality of leadframes, and applying to each leadframe a mold compound over at least a portion of any die on the leadframe and at least a portion of the leadframe. The sawing of the semiconductor wafer includes providing a cutting table, securing the semiconductor wafer in a sawing position, and applying a spinning saw blade to the wafer secured in the sawing position to cut the wafer into a plurality of separated die. The sawing of the semiconductor wafer further includes applying a first fluid for cooling to the semiconductor wafer proximate where the spinning saw blade touches the semiconductor wafer, and applying a second fluid, or clearing fluid, to substantially all of an exposed side (top for the orientation of the figures herein) of the semiconductor wafer. The applying a second fluid includes using a fluid ejector element (see, e.g., 216 in FIG. 2, 322 in FIG. 3, 417 in FIG. 4, 520 in FIG. 5, 702 in FIG. 7) proximate the cutting table and coupled to the cutting table. The fluid ejector element is positioned proximate an edge of the semiconductor wafer when mounted in the sawing position to eject the second fluid across substantially all of the exposed side of the semiconductor wafer and substantially parallel to the exposed side.

According to an aspect, a method of manufacturing an integrated circuit includes sawing a semiconductor wafer into separate die along one or more streets formed on the semiconductor wafer, attaching the plurality of die to a plurality of leadframes, interconnecting each of the plurality of die to a corresponding leadframe of the plurality of leadframes, and applying to each leadframe a mold compound over at least a portion of any die on the leadframe and at least a portion of the leadframe. The aspect of sawing a semiconductor wafer into separate die includes cutting the semiconductor wafer along the one or more streets to form a plurality of die. The semiconductor wafer has a first side and a second side, and the first side is exposed or open on the top for the orientation in the figures. The aspect of sawing a semiconductor wafer into separate die further includes applying a first fluid at a location proximate to where the semiconductor wafer is being cut for cooling, and ejecting (at least during sawing) a second or clearing fluid across substantially all of the first side of the semiconductor wafer in a layer of fluid to remove any of the first fluid that would otherwise be standing on the first side of the semiconductor wafer.

According to an aspect, a method for dicing a semiconductor wafer into separate die includes mounting the semiconductor wafer on a moveable cutting table, cutting the semiconductor wafer, and ejecting a clearing fluid across an exposed side (top for the orientation in the figures) of the semiconductor wafer at least during cutting, with full coverage across the semiconductor wafer. Full coverage means that at least 90 percent of the exposed side has the clearing fluid move across the exposed side. The aspect of ejecting the clearing fluid is to remove any other liquid fluids from standing on an exposed side of the semiconductor wafer. Ejecting a clearing fluid includes forming substantially a layer of clearing fluid that traverses the semiconductor wafer substantially parallel to the plane of the exposed side of the semiconductor wafer to remove any fluids, e.g., cooling fluids, on the exposed side of the semiconductor wafer.

According to an aspect, a system for sawing a semiconductor wafer includes a moveable cutting table for receiving the semiconductor wafer and having a sawing configuration, a dicing saw associated with the cutting table for cutting semiconductor wafers, and a fluid ejector element coupled to the moveable table. The fluid ejector element includes a plurality of nozzles (see, e.g., 216 in FIG. 2, 322 in FIG. 3, 417 in FIG. 4, 520 in FIG. 5, 702 in FIG. 7) configured to produce a layer of fluid that goes across the semiconductor wafer and provides full coverage.

Modifications are possible in the described embodiments, and other embodiments are possible, within the scope of the claims.

What is claimed is:
1. A method of manufacturing an integrated circuit, the method comprising:
   sawing a semiconductor wafer comprising:
      providing a cutting table,
      securing the semiconductor wafer in a sawing position,
      applying a spinning saw blade to the wafer secured in the sawing position to cut the wafer into a plurality of separated die,
      applying a first fluid for cooling to the semiconductor wafer proximate where the spinning saw blade touches the semiconductor wafer,
      applying a second fluid to substantially all of an exposed side of the semiconductor wafer; and
      wherein applying a second fluid comprises using a fluid ejector element proximate the cutting table and coupled to the cutting table and wherein the fluid ejector element is positioned proximate an edge of the semiconductor wafer when mounted in the sawing position to eject the second fluid across substantially all of the exposed side of the semiconductor wafer and substantially parallel to the exposed side;
   attaching the plurality of die to a plurality of leadframes;
   interconnecting each of the plurality of die to a corresponding leadframe of the plurality of leadframes; and
   applying to each leadframe a mold compound over at least a portion of any die on the leadframe and at least a portion of the leadframe.

2. The method of manufacturing an integrated circuit of claim 1, wherein applying a second fluid comprises using the fluid ejector element comprising a plurality of nozzles.

3. The method of manufacturing an integrated circuit of claim 1, wherein applying a second fluid comprises using the fluid ejector element comprising a plurality of nozzles mounted on an arced housing.

4. The method of manufacturing an integrated circuit of claim 1, wherein applying a second fluid comprises using the fluid ejector element that is coupled to the cutting table proximate an edge of a mounting portion of the cutting table and wherein the fluid ejector element moves with the cutting table.

5. The method of manufacturing an integrated circuit of claim 1, wherein applying a second fluid comprises mounting a fluid ejector element proximate an edge of a mounting portion of the cutting table and ejecting the second fluid through the fluid ejector element onto substantially all of the exposed side of the semiconductor wafer from one edge to an opposite edge of the semiconductor wafer.

6. The method of manufacturing an integrated circuit of claim 1, wherein applying a second fluid comprises using the fluid ejector element comprising a plurality of nozzles mounted on an arced housing that has a nozzle interval greater than 2 millimeters.

7. The method of manufacturing an integrated circuit of claim 1, wherein applying a second fluid comprises ejecting the second fluid from the fluid ejector that is more than 35 mm away from an edge of the cutting table.

8. The method of manufacturing an integrated circuit of claim 1, wherein the applying a second fluid comprises ejecting the second fluid through the fluid ejector element at a rate in the range of 4 to 8 liters/minute.

9. The method of manufacturing an integrated circuit of claim 1, wherein applying a second fluid comprises ejecting deionized water.

10. The method of manufacturing an integrated circuit of claim 1, wherein securing the semiconductor wafer in a sawing position comprises securing a semiconductor wafer comprising copper.

11. The method of manufacturing an integrated circuit of claim 1, wherein securing the semiconductor wafer in a sawing position comprises securing a semiconductor wafer comprising a plurality of integrated circuits with a bonding layer over active circuitry that further comprises copper.

12. A method of manufacturing an integrated circuit, the method comprising:
sawing a semiconductor wafer into separate die along one or more streets formed on the semiconductor wafer;
wherein the method of sawing a semiconductor wafer into separate die comprises:
cutting the semiconductor wafer along the one or more streets to form a plurality of die, wherein the semiconductor wafer has a first side and a second side, and wherein the first side is exposed,
applying a first fluid at a location proximate to where the semiconductor wafer is being cut for cooling, and
ejecting, at least during sawing, a second fluid across substantially all of the first side of the semiconductor wafer in a layer of fluid to remove any of the first fluid that would otherwise be standing on the first side of the semiconductor wafer;
attaching the plurality of die to a plurality of leadframes;
interconnecting each of the plurality of die to a corresponding leadframe of the plurality of leadframes; and
applying to each leadframe a mold compound over at least a portion of any die on the leadframe and at least a portion of the leadframe.

13. The method of claim 12, further comprising mounting the semiconductor wafer to a moveable cutting table, and wherein the second side is against the cutting table.

14. The method of claim 12, wherein applying a first fluid comprises using a nozzle coupled to a saw-blade unit to eject a cooling fluid.

15. The method of claim 12, wherein ejecting a second fluid comprises using a fluid ejector element coupled to the cutting table and ejecting the second fluid substantially parallel to the first side.

16. The method of claim 12, wherein applying a first fluid comprises using a nozzle coupled to a saw-blade unit and wherein ejecting a second fluid comprises using a fluid ejector element coupled to the cutting table.

17. The method of claim 12, wherein ejecting a second fluid comprises using a fluid ejector element coupled to the cutting table and wherein the fluid ejector element comprises a plurality of nozzles.

18. The method of claim 12, wherein ejecting a second fluid comprises using a fluid ejector element coupled to the cutting table and wherein the fluid ejector element comprises a plurality of nozzles mounted on an arced housing.

19. The method of claim 12, wherein ejecting a second fluid comprises using a fluid ejector element coupled to the cutting table and wherein the fluid ejector element is coupled to the cutting table proximate an edge of the cutting table and the fluid ejector element moves with the cutting table.

20. The method of claim 12, wherein ejecting, during sawing, a second fluid comprises using a plurality of nozzles mounted on an arced housing and having a nozzle interval greater than 2 millimeters to eject the second fluid.

21. The method of claim 12, wherein sawing a semiconductor wafer comprises sawing a semiconductor wafer that comprises copper.

22. The method of claim 12, wherein sawing a semiconductor wafer comprises sawing a semiconductor wafer that comprises a plurality of integrated circuits with a bonding layer over active circuitry that further comprises copper.

23. A method for dicing a semiconductor wafer into separate die, the method comprising:
mounting the semiconductor wafer on a moveable cutting table;
cutting the semiconductor wafer;
ejecting a clearing fluid across an exposed side of the semiconductor wafer at least during cutting, with full coverage across the semiconductor wafer, wherein full coverage means that at least 90 percent of the exposed side has the clearing fluid move across the exposed side, and wherein ejecting the clearing fluid is to remove any other liquid fluids from standing on the exposed side of the semiconductor wafer;
wherein ejecting a clearing fluid includes forming substantially a layer of clearing fluid that traverses the semiconductor wafer substantially parallel to the plane of the exposed side of the semiconductor wafer to remove any fluids on the exposed side of the semiconductor wafer.

24. A system for sawing a semiconductor wafer, the system comprising:
a moveable cutting table for receiving the semiconductor wafer;
a dicing saw associated with the cutting table for cutting semiconductor wafers;
a fluid ejector element coupled to the moveable table, the fluid ejector element having a plurality of nozzles configured to produce substantially a layer of fluid that goes across the semiconductor wafer parallel to an exposed side of the semiconductor wafer and provides full coverage, wherein full coverage means that at least 90 percent of the exposed side has the clearing fluid move across the exposed side.

25. The system of claim 24, wherein the plurality of nozzles of the fluid ejector element are mounted on an arced housing coupled more than 30 millimeters from an edge of the cutting table and wherein the plurality of nozzles have an interval greater than 2 millimeters between nozzles.

26. The system of claim 25, wherein the arced housing has a length comprising the plurality of nozzles that is at least equal to the diameter of a semiconductor wafer to be cut by the system.

* * * * *